(12) United States Patent
Bageshwar et al.

(10) Patent No.: US 8,862,419 B2
(45) Date of Patent: Oct. 14, 2014

(54) CRANE JIB ATTITUDE AND HEADING REFERENCE SYSTEM CALIBRATION AND INITIALIZATION

(75) Inventors: Vibhor L. Bageshwar, Minneapolis, MN (US); Michael Ray Elgersma, Plymouth, MN (US); Balaji Mahadev, Karnataka (IN); Brian E. Fly, Clearwater, FL (US); Steven P. Cienciwa, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 848 days.

(21) Appl. No.: 13/090,015

(22) Filed: Apr. 19, 2011

(65) Prior Publication Data

US 2012/0271582 A1 Oct. 25, 2012

(51) Int. Cl.
| G01C 17/38 | (2006.01) |
| B66C 1/02 | (2006.01) |
| G01R 33/02 | (2006.01) |
| B66C 13/46 | (2006.01) |
| B66C 23/26 | (2006.01) |
| G01R 33/028 | (2006.01) |
| G01R 33/00 | (2006.01) |

(52) U.S. Cl.
CPC .............. *G01R 33/028* (2013.01); *B66C 13/46* (2013.01); *B66C 23/26* (2013.01); *G01R 33/0035* (2013.01)
USPC .............................. 702/92; 414/561; 324/244

(58) Field of Classification Search
USPC ......... 702/92, 85, 94–95, 105, 127, 150–153, 702/188–189; 414/1, 10, 560–561, 569; 212/71–72, 171, 179–180, 223, 225, 212/232, 245, 270, 273, 312, 317–318, 212/342; 324/202, 244–246; 33/316, 319, 33/328, 355 R
See application file for complete search history.

(56) References Cited

FOREIGN PATENT DOCUMENTS

| CN | 101804945 A | 8/2010 |
| FR | 2921954 A1 * | 4/2009 |
| FR | 2943653 A1 | 10/2010 |

OTHER PUBLICATIONS

Denechere et al., FR 2921954 A1—English version, Apr. 10, 2009, 12 pp.*
Sabatini, A. M.: Quaternion-Based Extended Kalman Filter for Determining Orientation by Inertial and Magnetic Sensing, XP002522559, IEEE Transactions on Biomedical Engineering, vol. 53, No. 7; Jul. 1, 2006, Piscataway, NJ; pp. 1346-1356.
Guo, P. et al.: The Soft Iron and Hard Iron Calibration Method Using Extended Kalman Filter for Attitude and Heading Reference System; Position, Location and Navigation Symposium, XP031340826, 2008 IEEE/ION, IEEE, Piscataway, NJ, May 5, 2008, pp. 1167-1174.
Extended EP Search Report for EP 12 163 498.4 dated Jul. 27, 2012.

* cited by examiner

*Primary Examiner* — Toan Le
(74) *Attorney, Agent, or Firm* — Ingrassia Fisher & Lorenz P.C.

(57) ABSTRACT

Methods and apparatus are provided for calibrating and initializing/aligning an attitude and heading reference system of a crane jib. Magnetometer measurements are generated using a magnetometer that is attached to the crane jib, while crane jib maneuvers are performed including crane jib slewing. The magnetometer measurements are supplied to a processor that is configured to generate magnetometer calibration parameters using the magnetometer measurements and to initialize and align a plurality of filters.

17 Claims, 6 Drawing Sheets

CRANE JIB ATTITUDE AND HEADING REFERENCE SYSTEM CALIBRATION AND INITIALIZATION

TECHNICAL FIELD

The present invention generally relates to an attitude and heading reference system, and more particularly relates to a method of calibrating and initializing an attitude and heading reference system for the jib of a crane.

BACKGROUND

Tower cranes are used in myriad environments. Two of the more common environments are construction sites and shipbuilding facilities, because of the combination of height and lifting capacity this type of crane provides. A tower crane typically includes a base, a mast, and a crane jib. The base is fixed to the ground, and is also connected to the mast. A slewing unit is connected to the mast and is used to rotate the crane. The crane jib includes, among other things, a load-bearing section, a counter jib section, and the operator cab.

The load-bearing section of the crane jib typically carries a load. The counter jib section is connected to the load-bearing section, and carries a counterweight to balance the crane jib while the load-bearing section is carrying a load. The operator cab is usually located near the top of the mast, and may be attached to the crane jib. However, other tower cranes may have the operator cab mounted partway down the mast. No matter its specific location, a crane operator sits in the operator cab and controls the crane. In some instances, a crane operator can remotely control one or more tower cranes from the ground.

In some environments, a plurality of tower cranes may be operated in relatively close proximity. Thus, while it is unlikely, it has been postulated that the crane jibs of two or more tower cranes could collide. Hence, there is a need for a collision avoidance/warning system that is able to determine the three-dimensional (3D) angular orientation (e.g., attitude and heading angle) of a crane's own crane jib and of other crane jibs working at a particular site. There is also a need for a method to compute calibration parameters associated with magnetometer measurements in the tower crane operating environment, and to initialize/align the filters implemented in the system. The present invention addresses at least this need.

BRIEF SUMMARY

In one embodiment, a method of calibrating an attitude and heading reference system of a crane jib includes collecting magnetometer measurements using a magnetometer that is attached to the crane jib, while one or more crane jib maneuvers are performed. The magnetometer measurements are supplied to a processor, which generates magnetometer calibration parameters using the magnetometer measurements.

In another embodiment, a method of calibrating an attitude and heading reference system of a crane jib includes rendering commands on a display device that inform an operator to implement one or more crane jib maneuvers. Magnetometer measurements are generated using a magnetometer that is attached to the crane jib, while the one or more crane jib maneuvers are being implemented. The magnetometer measurements are supplied to a processor, which generates magnetometer calibration parameters using the magnetometer measurements.

In yet another embodiment a crane jib attitude and heading reference system includes a plurality of magnetometers and a processor. Each magnetometer is configured to sense the local magnetic field at least proximate the crane jib and supply magnetometer signals representative thereof. The processor is coupled to receive the magnetometer signals and is configured, upon receipt thereof, to generate magnetometer calibration parameters.

Furthermore, other desirable features and characteristics of the crane jib attitude and heading reference system calibration and initialization will become apparent from the subsequent detailed description and the appended claims, taken in conjunction with the accompanying drawings and the preceding background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description. In this regard, although the attitude and heading reference system is described herein as being implemented with a tower crane, it will be appreciated that it can be implemented with other types of cranes, such as luffing cranes.

Figure 1:
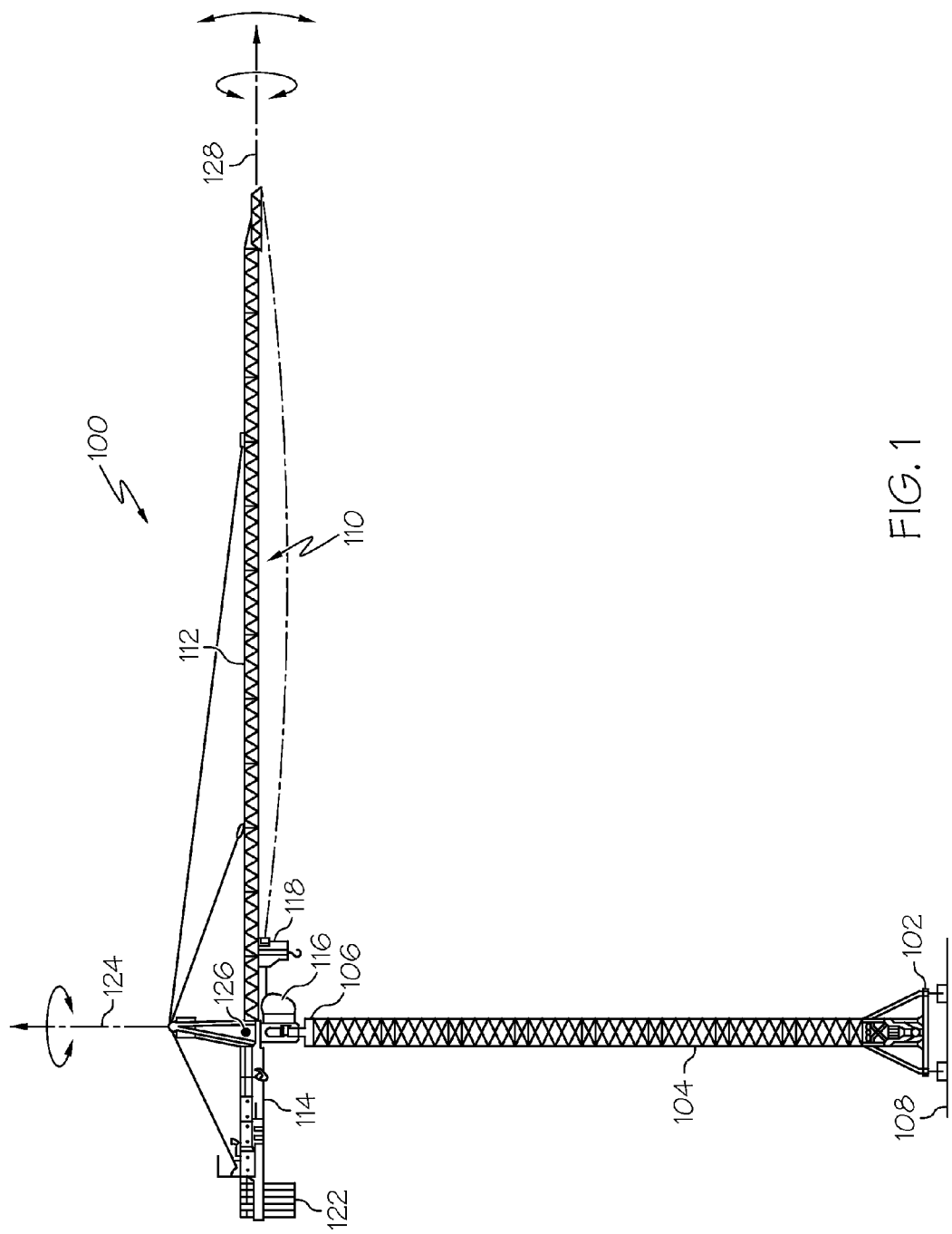
FIG. 1 depicts a side view of an embodiment of a tower crane.

Referring first to FIG. 1, a side view of one embodiment of a tower crane 100 is depicted. The depicted crane 100 is a tower crane, though any one of numerous other types of cranes could also be used. The depicted crane 100 includes a base 102, a mast 104, and a slewing unit 106. The base is affixed to a surface 108, such as the ground, and is used to support the remainder of the components that comprise the tower crane 100. The mast 104, which may be implemented as an adjustable height mast, is coupled at one end to the base 102. The slewing unit 106 is rotationally coupled to the opposing end of the mast 104, and is additionally coupled to a crane jib structure 110, which includes a load-bearing section 112, a counter jib section 114, and an operator cab 116. Before proceeding further, it is noted that when the term "crane jib" is used herein, it encompasses: the entire crane jib structure 110, the load-bearing section 112 and the counter jib section 114, just the load-bearing section 112, or just the counter jib section 114.

The load-bearing section 112, which in the depicted embodiment comprises a plurality of lattice-structure elements, is coupled at one end to the slewing unit 106 and extends therefrom to a second end. A cable trolley 118 may be mounted on the load-bearing section 112 and may be controllably moved to a plurality of positions between the ends of the load-bearing section 112. The counter jib section 114 is coupled to the slewing unit 106 on a side opposite the load-bearing section 112, and has a counter weight 122 coupled thereto. The operator cab 116 is coupled to the slewing unit 106 and, at least in the depicted embodiment, is located under the load-bearing section 112.

An operator, disposed within the operator cab 116, controls the tower crane 100. In particular, an operator, via a plurality of non-illustrated motors and gear sets, may rotate the slewing unit 106, and thus the crane jib, relative to the mast 104, about a first orthogonal axis 124. The dynamics of the crane jib during operation, as well as the environmental conditions, may additionally cause the crane jib to rotate about a second orthogonal axis 126 (depicted as a dot to represent an axis into and out of the plane of the paper), and a third orthogonal axis 128. As used herein, rotation about the first orthogonal axis 124 varies the heading angle of the crane jib, rotation about the second orthogonal axis 126 varies the pitch angle of the crane jib, and rotation about the third orthogonal axis 128 varies the roll angle of the crane jib.

Figure 2:
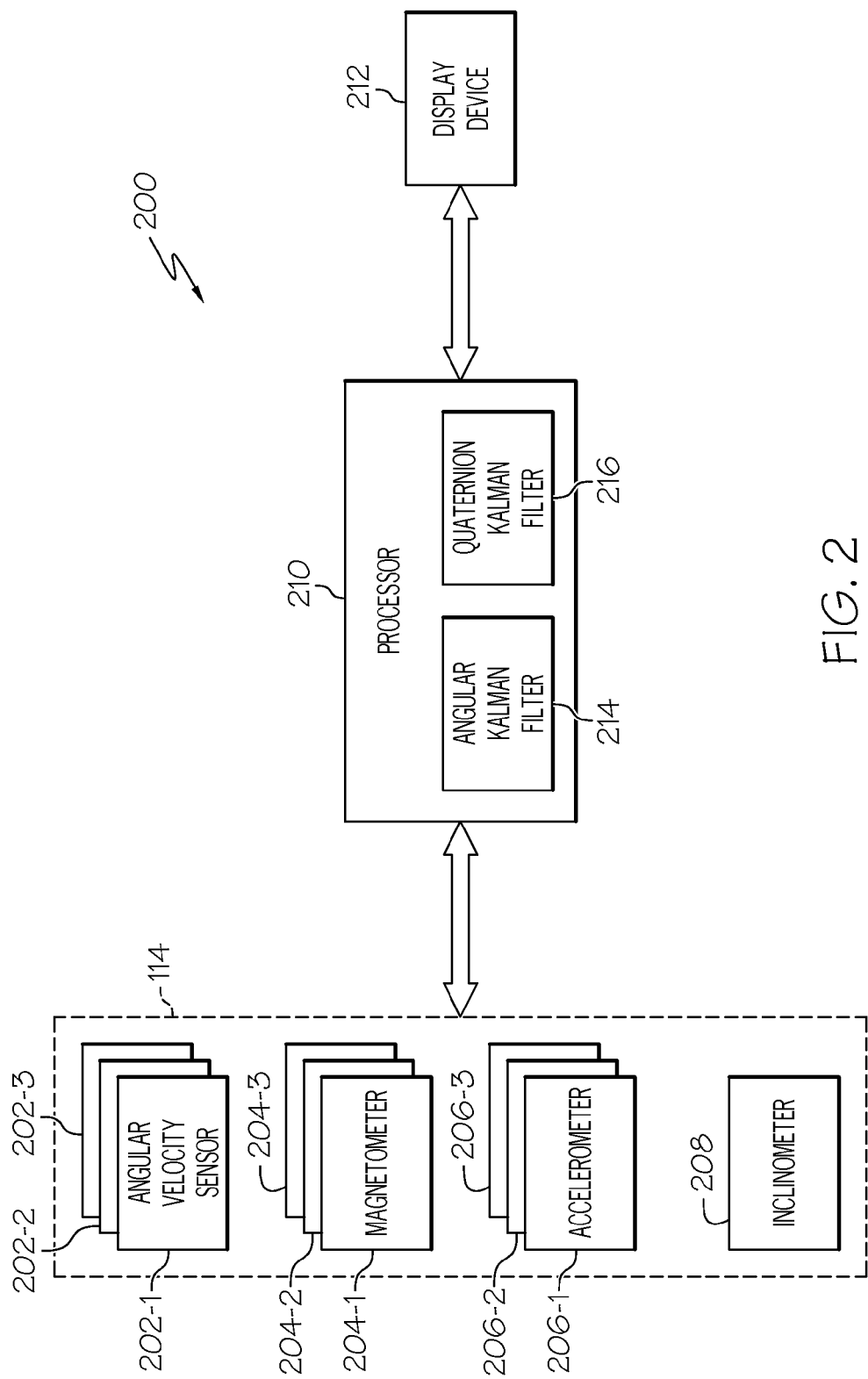
FIG. 2 depicts a functional block diagram of a crane jib attitude and heading reference system (AHRS) that may be used in the tower crane of FIG. 1.

The tower crane 100 may, in some instances, be operated in relatively close proximity with one or more other, non-illustrated tower cranes. Thus, to even further reduce the likelihood that the crane jib 110 will collide with that of another tower crane, the depicted tower crane 100 is additionally equipped with a crane jib attitude and heading reference system (AHRS). An exemplary embodiment of the crane jib AHRS 200 is depicted in FIG. 2 and with reference thereto will now be described.

The depicted crane jib AHRS 200 includes a plurality of crane jib angular velocity sensors 202 (202-1, 202-2, 202-3), a plurality of magnetometers 204 (204-1, 204-2, 204-3), a plurality of accelerometers 206 (206-1, 206-2, 206-3), an inclinometer 208, a processor 210, and a display device 212. The crane jib angular velocity sensors 202 are each configured to sense the angular velocity of the crane jib, and supply angular velocity signals representative thereof. The magnetometers 204 are each configured to sense the local magnetic field at least proximate the crane jib, and supply magnetometer signals representative thereof. More specifically, the magnetometers 204 provide a measurement of the local magnetic field vector resolved along the orientations of the measurement axes. Because the magnetometers 204 are attached to the crane jib 110, the magnetometers 204 and the crane jib 110 have a fixed relative orientation. Hence, the orientation of the magnetometers 204 is directly correlative to that of the crane jib 110. The accelerometers 206 are each configured to sense forces acting on a proof mass (not depicted), and supply specific force signals representative thereof. The inclinometer 208 is configured to sense the roll angle and the pitch angle of the crane jib, and supply inclinometer signals representative thereof.

It will be appreciated that the number and type of crane jib angular velocity sensors 202, the number and type of magnetometers 204, and the number and type of accelerometers 206, may vary. In the depicted embodiment, however, the crane jib angular velocity sensors 202 are implemented using three, orthogonally disposed rate gyroscopes ("gyros"), the magnetometers 204 are implemented using three, orthogonally disposed magnetometers, and the accelerometers 206 are implemented using three, orthogonally disposed accelerometers. Although the specific type of rate gyros 202, magnetometers 204, accelerometers 206, and inclinometer 208 that are used may also vary, in one particular embodiment, an HG1171 Inertial Measurement Unit (IMU) manufactured by Honeywell International, Inc., and which includes all of these devices in a single housing, is used. It will be appreciated that in other embodiments, separately housed sensors may be used.

No matter the specific implementation of the crane jib angular velocity sensors 202, the magnetometers 204, the accelerometers 206, and the inclinometer 208, the processor 210 is coupled to receive the angular velocity signals, the magnetometer signals, the specific force signals, and the inclinometer signals, respectively, therefrom. The processor 210 is configured, in response to these signals to determine the attitude and heading angle of the crane jib. The processor 210 additionally supplies image rendering display commands to the display device 212. The image rendering display commands cause the display device 212 to render the determined crane jib attitude and heading angle thereon.

Before proceeding further, it should be noted that the display device 212 may be implemented using any one of numerous known display devices suitable for rendering image and/or text data in a format viewable by a crane operator. Non-limiting examples of such display devices include various cathode ray tube (CRT) displays, and various flat panel displays such as, various types of LCD (liquid crystal display) and TFT (thin film transistor) displays, just to name a few.

The processor 210 is configured to implement various functions in order to determine the attitude and heading angle of the crane jib from the angular velocity signals, the magnetometer signals, the specific force signals, and the inclinometer signals. In particular, and as FIG. 2 further depicts, the processor 210 implements two Kalman filters—a first Kalman filter 214 and a second Kalman filter 216. As will be described in more detail below, the first Kalman filter 214, which is referred to herein as a velocity Kalman filter, computes predictions of the velocity of the crane jib, and predictions of accelerometer bias. The measurement vector for the velocity Kalman filter 214 is the velocity of the crane jib, which is computed from corrected angular velocity measurements. The computed velocity of the crane jib 110 is also used to compute the acceleration of the crane jib 110, which is used to correct the roll angle and pitch angle sensed by the inclinometer. The second Kalman filter 216, which is referred to herein as the quaternion Kalman filter, computes predictions of angular velocity sensor bias, and determines the attitude and heading angle of the crane jib. The measurement vector for the quaternion Kalman filter 216 comprises the above-mentioned corrected crane jib roll and the pitch angles, and crane jib heading angle that is determined from the magnetometer signals. It should be noted that crane jib heading angle is the heading angle relative to the initial angular orientation of the crane jib.

As is generally known, a Kalman filter implements an iterative two-step prediction-correction process to estimate a state vector. The prediction portion of this process is sometimes referred to as "the time update" because differential equations (e.g., a dynamic model) that govern the state vector are propagated forward in time. The computational resultants from the prediction portion of the process may be referred to as a priori estimates of the state vector. The correction portion of this process is sometimes referred to as "the measurement update" because a measurement vector is used to correct the a priori estimates of the state vector that are computed in the prediction step. The computational resultants from the correction portion of the process may be referred to as posterior estimates of the state vector.

The crane jib AHRS 200, as was just noted, includes two Kalman filters 214, 216. The two Kalman filters 214, 216 operate together. Thus, the overall process implemented in processor 210 includes two prediction steps and two correction steps. Moreover, the depicted Kalman filters 214, 216 are configured such that a measurement vector drives the prediction steps and the correction steps. The overall process 300 implemented in the processor 210 is depicted in flowchart form in FIG. 3, and comprises the following iterative steps: predictions by the velocity Kalman filter 214 (302), predictions by the quaternion Kalman filter 216 (304), corrections by the velocity Kalman filter 214 (306), various intermediate calculations (308), and corrections by the quaternion Kalman filter 304 (310). Because the process is iterative, these process steps are performed sequentially over and over again.

Figure 3:
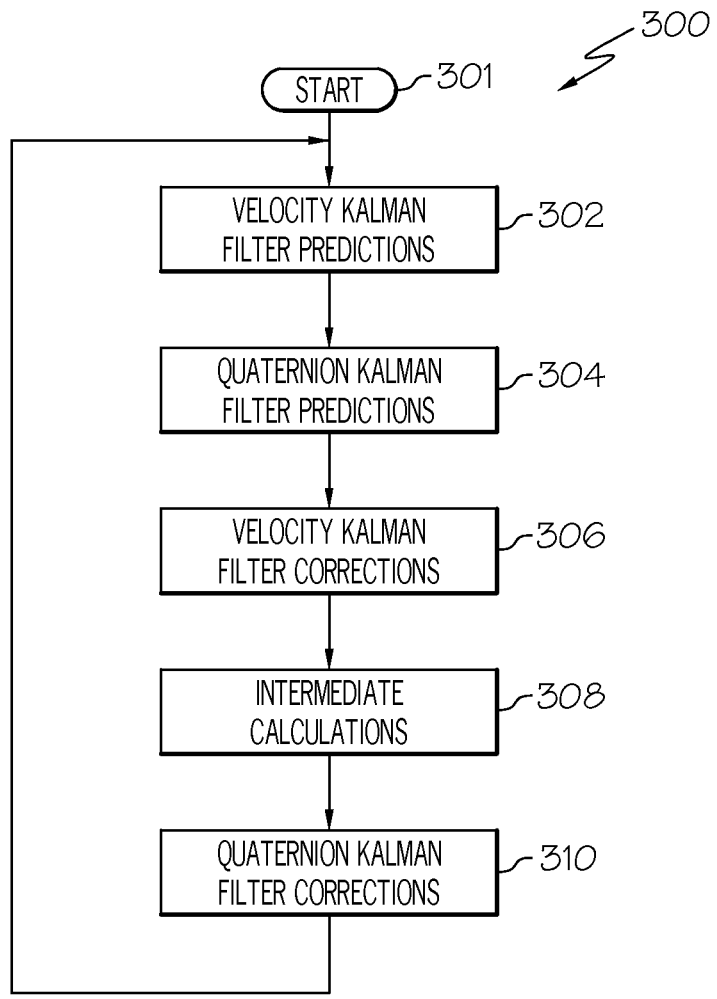
FIG. 3 depicts a process, in flowchart form, that is implemented by the crane jib AHRS of FIG. 2.
Figure 4:
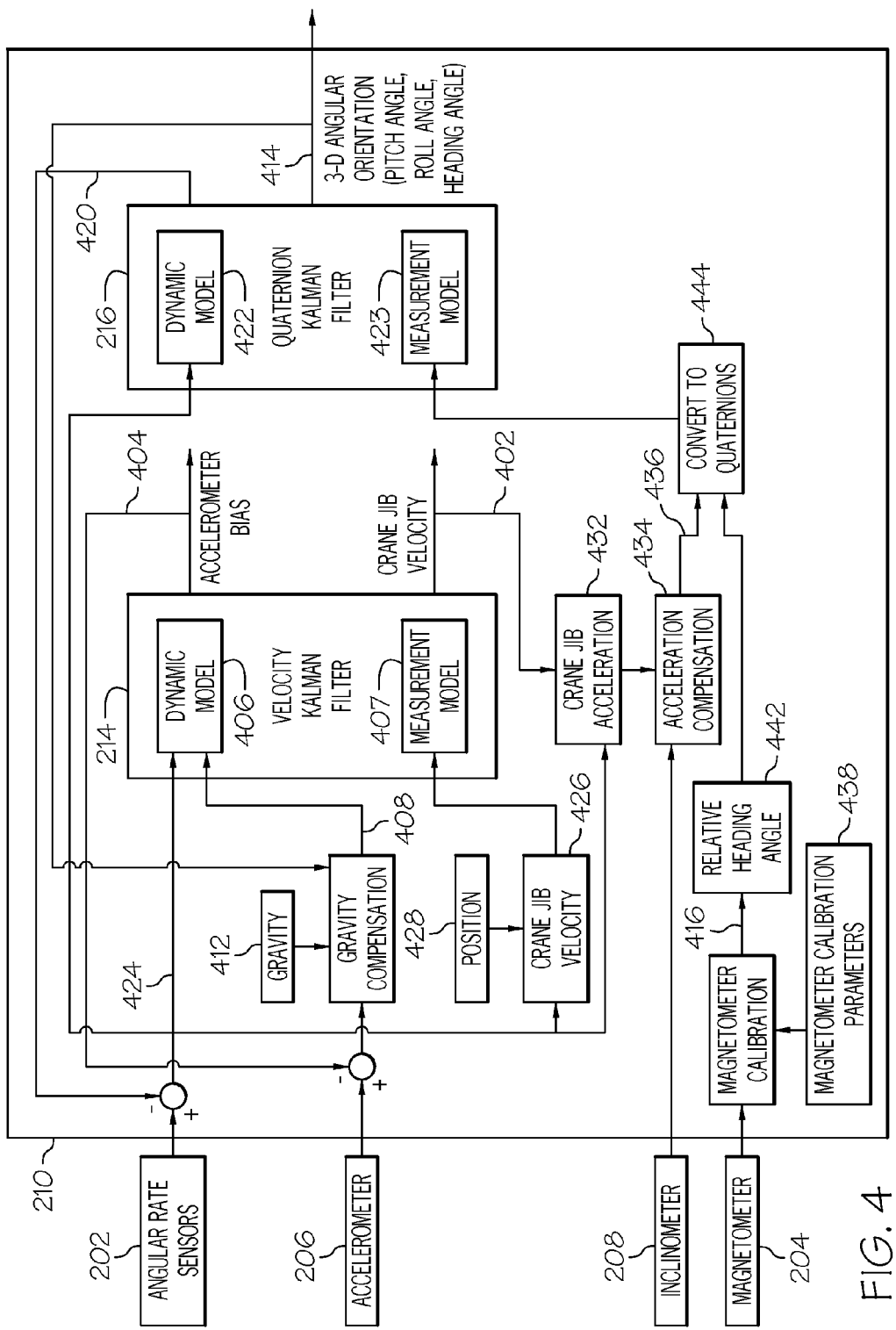
FIG. 4 depicts the crane jib AHRS of FIG. 2 with various functions implemented within the processor, when carrying out the process of FIG. 3, depicted in more detail.

With reference now to FIG. 4, which depicts various functions implemented within the processor 210 in more detail, the process depicted in FIG. 3 and described generally above will now be described in more detail. The velocity Kalman filter prediction step (302) is performed first. During this step, the velocity Kalman filter 214 computes predictions of crane jib velocity 402, and predictions of accelerometer bias 404. These predictions are computed using a dynamic model 406, which is described in more detail below. The measurements used to drive the velocity Kalman filter prediction step (302) are compensated angular velocity measurements 424 and compensated accelerometer measurements 408. The compensated angular velocity measurements are the angular velocity signals supplied from the angular velocity sensors 202 that have been compensated by the angular velocity sensor bias 420 (e.g., the posterior estimate from the previous time step). The compensated accelerometer measurements 408 are accelerometer signals supplied from the accelerometers 206 that have been compensated for accelerometer bias 404 (e.g., the posterior estimate from the previous time step) and gravity 412.

During the quaternion Kalman filter prediction step (304), the quaternion Kalman filter 216 computes predictions of crane jib 3D angular orientation 414 (pitch angle, roll angle, and heading angle), and predictions of angular velocity sensor bias 420. These predictions are also computed using a dynamic model 422, which is also described in more detail below. The measurements used to drive the quaternion Kalman filter prediction step (304) are compensated angular velocity measurements 424.

The velocity Kalman filter correction step (306) is driven using a computed crane jib velocity 426, which is supplied to a measurement model 407. The measurement model 407, like the dynamic model 406, will be described further below. The crane jib velocity 426 that is supplied to the measurement model 407 is computed from corrected angular velocity measurements 424 and the known position 428 (on the crane jib 110) of the angular velocity sensors 202. As was just noted, the corrected angular velocity measurements 424 are computed using the angular velocity signals supplied from the angular velocity sensors 202 and the posterior estimates of the angular velocity sensor bias 420. It is additionally noted that the predictions of crane jib velocity 402 and accelerometer bias 404 that are computed after the velocity Kalman filter correction step (302) are the posterior estimates of crane jib velocity 402 and accelerometer bias 404.

During the intermediate calculations step (308), several intermediate calculations are performed. These calculations include computing crane jib acceleration 432 using the posterior estimate of crane jib velocity 402 and the corrected crane jib angular velocity measurements 424 (computed using the posterior estimate of angular velocity sensor bias 420). Acceleration compensation 434 is applied to the inclinometer signals supplied from the inclinometer 208 using the computed crane jib acceleration 432. This compensation removes crane jib acceleration components from the sensed crane jib roll angle and the sensed crane jib pitch angle, to thereby supply corrected crane jib roll angle measurements and corrected crane jib pitch angle measurements 436. Magnetometer calibration parameters 438 are applied to the magnetometer signals supplied from the magnetometers 204, to thereby generate calibrated magnetometer measurements 416. The calibration parameters 438 may be determined during an initial alignment procedure. The heading angle 442 of the crane jib 110 (relative to its initial angular orientation) is then calculated using the calibrated magnetometer measurements 416. The corrected crane jib roll angle and pitch angle measurements 436 and the heading angle 442 are then converted to quaternions 444 and supplied to the quaternion Kalman filter 216. It should be noted that conversion to, and subsequent use of, quaternions is just one technique that may be used to parameterize 3D angular orientation, and that numerous other attitude parameterization methods may be used. Some non-limiting examples include Euler angles, Rodrigues parameters, and direction cosines, just to name a few.

After the intermediate calculations step (308), the quaternion Kalman filter correction step (310) is performed. This step is driven using the corrected roll angle and pitch angle 434 that are computed from the inclinometer signals, and the heading angle 442 computed from the calibrated magnetometer measurements 438 (and that were converted to quaternions 444). These values are supplied to a measurement model 423, which will also be described further below. The posterior estimates of crane jib 3D angular orientation 414 (e.g., roll angle, pitch angle, and heading angle), and angular velocity sensor bias 420 are computed. The posterior estimates of crane jib 3D angular orientation 414 are used to generate image rendering display commands, which are supplied to the display device 212. The display device 212, as previously noted, renders an image of the crane jib attitude and heading angle.

It was noted in the discussion above that the dynamic models 406 and 422 in the velocity Kalman filter 214 and the quaternion Kalman filter 216, respectively, would be described, as would the measurement models 407 and 423 in the velocity Kalman filter 214 and the quaternion Kalman filter 216, respectively. For completeness, these descriptions will now be provided. Beginning first with the velocity Kalman filter 214, the dynamic model it implements is mathematically represented as follows:

$$\begin{bmatrix} \dot{\vec{v}}_{sensor} \\ \dot{\vec{b}}_{f1} \end{bmatrix} = \begin{bmatrix} -(\vec{\omega}_m - \vec{b}_g - \vec{n}_g)^\times & -I \\ 0 & -\frac{1}{\tau_a}I \end{bmatrix}$$

$$\begin{bmatrix} \vec{v}_{sensor} \\ \vec{b}_{f1} \end{bmatrix} + \begin{bmatrix} I \\ 0 \end{bmatrix}(\vec{f}_m - \vec{b}_{f0} + C_{bN}\vec{g}) + \begin{bmatrix} -I & 0 \\ 0 & I \end{bmatrix}\begin{bmatrix} \vec{n}_f \\ \vec{n}_{f1} \end{bmatrix}$$

-continued $$Q_{v,w} = \text{diag}\left[ \sigma_{fx}^2 \quad \sigma_{fy}^2 \quad \sigma_{fz}^2 \quad \frac{2\sigma_{f1x}^2}{\tau_a} \quad \frac{2\sigma_{f1y}^2}{\tau_a} \quad \frac{2\sigma_{f1z}^2}{\tau_a} \right],$$

where $\vec{v}_{sensor}$ is the velocity vector of the sensor, $\vec{\omega}_m$ is the measured angular velocity vector of the crane jib, $\vec{f}_m$ is the measured specific force vector of the crane jib, $\vec{g}$ is the local gravity vector, $\vec{b}_g$ is the rate gyro bias vector, $\vec{n}_g$ is the rate gyro measurement noise vector, $\vec{b}_f$ is the accelerometer bias vector, $\vec{b}_{f0}$ is the accelerometer bias null shift vector, $\vec{b}_{f1}$ is the accelerometer bias drift rate vector, $\vec{n}_f$ is the accelerometer measurement noise vector, $\vec{n}_{f1}$ is the accelerometer bias Gauss-Markov driving-process noise vector, $\sigma_f$ is the standard deviation of the accelerometer measurement noise, $\sigma_{f1}$ is the standard deviation of the accelerometer bias Gauss-Markov driving-process noise, $\tau_a$ is the correlation time of the accelerometer bias Gauss-Markov process, $Q_{v,w}$ is the power spectral density of the velocity Kalman filter process noise vector defined by the accelerometer measurement noise vector and the accelerometer bias Gauss-Markov driving-process noise vector, and $C_{bN}$ is the direction cosine matrix from the crane jib navigation frame to the sensor body frame.

And the measurement model implemented by the velocity Kalman filter 214 is mathematically represented as follows:

$$(\vec{\omega}_m - \vec{b}_g)^x \vec{r}_{sensor} = [I \quad 0]\begin{bmatrix} \vec{v}_{sensor} \\ \vec{b}_{f1} \end{bmatrix} - (\vec{r}_{sensor})^x \vec{n}_g$$

$$R_v = (\vec{r}_{sensor})^x \text{diag}[\sigma_{gx}^2 \quad \sigma_{gy}^2 \quad \sigma_{gz}^2](\vec{r}_{sensor})^{xT} + (1e-6)I,$$

where, in addition to those variables previously defined, $\vec{r}_{sensor}$ is the position vector of the sensor relative to crane jib's center of rotation, $\sigma_g$ is the standard deviation of the rate gyro measurement noise, and $R_v$ is the covariance matrix of the crane jib angular velocity computed from the compensated angular velocity measurements and sensor position vector.

The dynamic model implemented in the quaternion Kalman filter 216 is mathematically represented as follows:

$$\begin{bmatrix} \delta \dot{\bar{q}}(t) \\ \vec{b}_{g1}(t) \end{bmatrix} = \begin{bmatrix} -(\vec{\omega}_m - \vec{b}_g)^x & -\frac{1}{2}I \\ 0 & -\frac{1}{\tau_g}I \end{bmatrix} \begin{bmatrix} \delta \bar{q}(t) \\ \vec{b}_{g1}(t) \end{bmatrix} + \begin{bmatrix} -\frac{1}{2}I & 0 \\ 0 & I \end{bmatrix} \begin{bmatrix} \vec{n}_g(t) \\ \vec{n}_{g1}(t) \end{bmatrix}$$

$$Q_{q,w} = \text{diag}\left[ \sigma_{gx}^2 \quad \sigma_{gy}^2 \quad \sigma_{gz}^2 \quad \frac{2\sigma_{g1x}^2}{\tau_g} \quad \frac{2\sigma_{g1y}^2}{\tau_g} \quad \frac{2\sigma_{g1z}^2}{\tau_g} \right],$$

where, in addition to those variables previously defined, $\delta \bar{q}$ is the vector error component of the estimated quaternion, $\vec{b}_{g0}$ is the rate gyro bias null shift vector, $\vec{b}_{g1}$ is the rate gyro bias drift rate vector, $\vec{n}_{g1}$ is the rate gyro bias Gauss-Markov driving-process noise vector, $\sigma_{g1}$ is the standard deviation of the rate gyro bias Gauss Markov driving-process noise, $\tau_g$ is the correlation time of the rate gyro bias Gauss Markov process, and $Q_{q,w}$ is the power spectral density of the quaternion Kalman filter process noise vector defined by the rate gyro measurement noise vector and the rate gyro bias Gauss-Markov driving-process noise vector.

And the measurement model implemented by the quaternion Kalman filter 216 is mathematically represented as follows:

$$-q_4 \hat{\bar{q}} + \bar{q}^x \hat{\bar{q}} + \hat{q}_4 \bar{q} = [I \quad 0]\begin{bmatrix} \delta \bar{q}(t) \\ \vec{b}_{g1}(t) \end{bmatrix}$$

$$R_q = \text{diag}\left[ \left[\frac{\sigma_{inc,x}}{2}\right]^2 \quad \left[\frac{\sigma_{inc,y}}{2}\right]^2 \quad \left[\frac{\sigma_{mag}}{2}\right]^2 \right],$$

where, in addition to those variables previously defined, $\bar{q}$ is the vector component of the estimated quaternion, $\hat{q}_4$ is the scalar component of the estimated quaternion, $\bar{q}$ is the vector component of the quaternion computed from the corrected roll angle and pitch angle 434 that are computed from the inclinometer signals, and the relative heading angle 442 computed from the calibrated magnetometer measurements 438, $q_4$ is the scalar component of the quaternion computed from the corrected roll angle and pitch angle 434 that are computed from the inclinometer signals, and the relative heading angle 442 computed from the calibrated magnetometer measurements 438, $\sigma_{inc,x}$ is the standard deviation of the roll angle inclinometer measurement, $\sigma_{inc,y}$ is the standard deviation of the pitch angle inclinometer measurement, $\sigma_{mag}$ is the standard deviation of the heading angle measurement computed from the calibrated magnetometer measurements 438, and $R_q$ is the covariance matrix of the crane jib attitude and heading angle measurements computed from the corrected roll angle and pitch angle 434 that are computed from the inclinometer signals, and the relative heading angle 442 computed from the calibrated magnetometer measurements 438.

Figure 5:
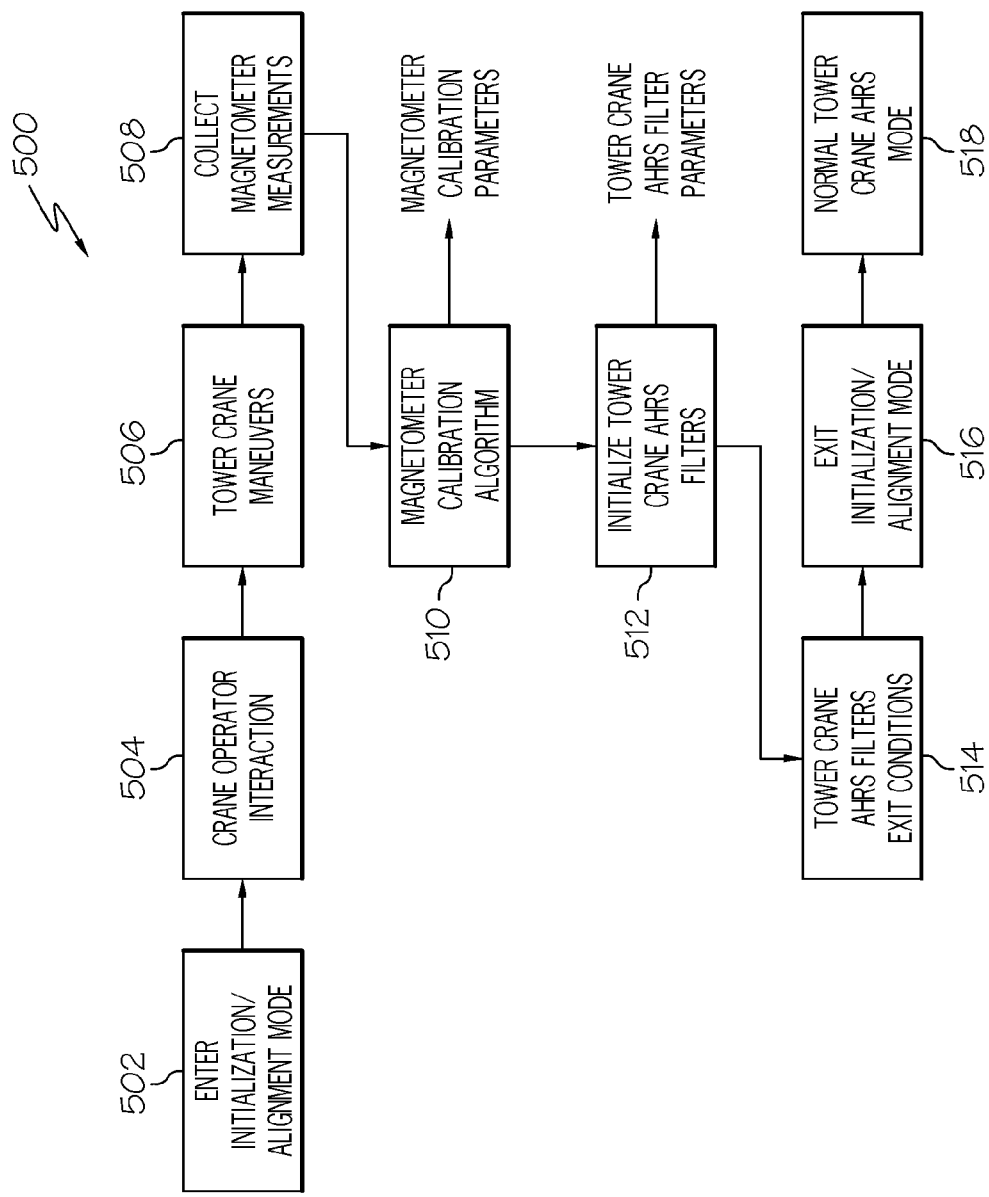
FIG. 5 depicts a process, in flowchart form, that is implemented to calibrate and initialize the crane jib AHRS of FIG. 2.

It should be noted that before the AHRS 200 is operated, it is initialized and aligned. The overall process 500 that is implemented to initialize and align the AHRS 200 is depicted in flowchart form in FIG. 5, and will now be described. The process 500 begins when the initialization/alignment mode is entered (502). Upon entry, the crane operator interacts with the AHRS 200 (504), and conducts predetermined tower crane maneuvers (506). During the maneuvers (506), magnetometer 204 measurements are collected (508). The magnetometer measurements are used in a magnetometer calibration algorithm (510) to generate magnetometer calibration parameters. The AHRS filters 214, 216 are then initialized (512) to meet certain exit conditions (514). Thereafter, the initialization/alignment mode is exited (516), and normal tower crane operation and normal tower crane AHRS operation may resume (518).

The initialization/alignment mode may be entered (502) in response to one or more conditions and/or activities. For example, the initialization/alignment mode may be entered upon the initial power-up of the AHRS 200. It may also be entered if a predetermined amount of time has elapsed since the last initialization/alignment process 500 was completed, if the AHRS filters 214, 216 are reset, or if a crane operator manually initiates the process 500. In some instances, the process 500 may also be entered when there is a shift change or an operator change.

Figure 6:
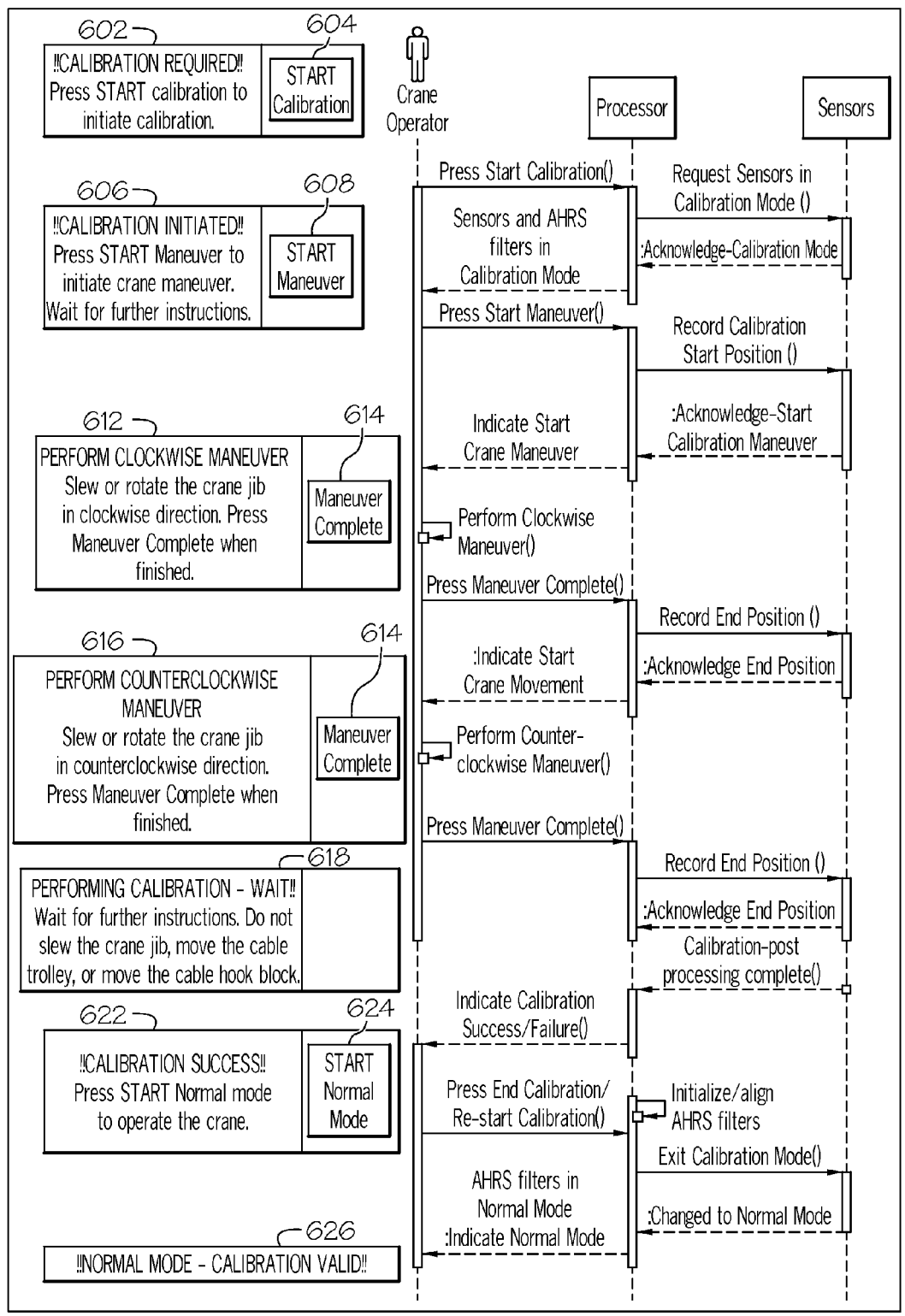
FIG. 6 depicts, in a different form and with differing details, the calibration sequence of the process depicted in FIG. 5.

No matter the specific event or reason that the initialization/alignment mode is entered (502), upon entry the operator interacts with the AHRS 200 (504), and conducts the predetermined tower crane maneuvers (506). The maneuvers and other activity that take place during this interaction (504) are depicted in FIG. 6. As depicted therein, the operator may be informed via, for example, the display device 212, that the initialization and alignment process 500 is needed. In the depicted embodiment, this is implemented by rendering "!!CALIBRATION REQUIRED!!" 602 on the display device 212 with instructions to "Press START Calibration to initiate calibration." It will be appreciated, however, that other techniques could be used to inform the operator. In any case, after being informed the operator will press a "START Calibration" icon or button 604. In response, the processor 210 requests the sensors 202-208 to enter the calibration mode, and receives an acknowledgement from the sensors 202-208. The display device 212, at least in the depicted embodiment, then displays "!!CALIBRATION INITIATED!!" 606 with instructions for the operator to "Press START Maneuver to initiate crane maneuver. Wait for further instructions." When the operator presses a "START Maneuver" icon or button 608, the processor 210 records the start position of the tower crane 100, and the operator controls the tower crane 100 to undergo the various tower crane maneuvers (506), which are discussed momentarily. The starting position and the end position for each tower crane jib maneuver are recorded by the AHRS 200.

The specific number and type of tower crane maneuvers (506) that are conducted may vary. For example, these maneuvers may include one or more of rotating the crane jib over the available range of motion, up to 360°, in the clockwise direction, rotating the crane jib over the available range of motion, up to 360°, in the counterclockwise direction, extending and retracting the cable trolley 118, and extending and retracting the cable hook block. As a minimum, at least one crane jib rotation over the available range of motion, in either direction, is needed. In the depicted embodiment, it is seen that a clockwise rotation and a counterclockwise rotation are performed. In particular, as FIG. 6 further depicts, after the operator presses the "START Maneuver" icon or button 608, the display device 212 displays "PERFORM CLOCKWISE MANEUVER" 612 with the message "Slew or rotate the crane jib in clockwise direction. Press Maneuver Complete when finished." The operator will then control the tower crane 100 to slew the crane jib in the clockwise direction and, when complete, press a "Maneuver Complete" icon or button 614. The display device 212 then displays "PERFORM COUNTERCLOCKWISE MANEUVER" 616 with the message "Slew or rotate the crane jib in counterclockwise direction. Press Maneuver Complete when finished." The operator will then control the tower crane 100 to slew the crane jib in the counterclockwise direction and, when complete, press the "Maneuver Complete" icon or button 614.

Thereafter, as FIG. 6 further depicts, the display device 212 may display "PERFORMING CALIBRATION-WAIT!!" 618 with the message "Wait for further instructions. Do not slew the crane jib, move the cable trolley, or move the cable hook block." During this time, the magnetometer calibration algorithm (510), which is discussed in more detail further below, is calculating the previously mentioned magnetometer calibration parameters 438 that are required by the AHRS filters 214, 216 during initialization (512) to meet certain exit conditions (514). When the AHRS filters 214, 216 are initialized, the display device 212 displays " "!!CALIBRATION SUCCESS!!" 622 along with the message "Press START Normal Mode to operate the crane." When the operator presses a "START Normal Mode" icon or button 624, the initialization/alignment mode is exited (516), and normal tower crane operation and AHRS filter operation may resume. The display device 212 may also display "!!NORMAL MODE-CALIBRATION VALID!!" 626.

Returning once again to FIG. 5, it was noted above that during each of the tower crane maneuvers, magnetometer measurements are collected (508). The collected magnetometer measurements are used in a magnetometer calibration algorithm (510) that is implemented in the processor 210. The magnetometer calibration algorithm (510), as was also noted above, generates the magnetometer calibration parameters 438 that are used in the AHRS 200 during normal system operation. These magnetometer calibration parameters 438 are generated using a magnetometer measurement model. One magnetometer measurement model is:

$$C_{bm}\vec{m}_m(t_k) = A_{mc}(t_k)\vec{m}_k(t_k) + C_{bm}\vec{b}_m(t_k) + C_{bm}\vec{n}_m(t_k),$$

where $\vec{m}_m$ is the magnetometer measurement vector, $\vec{m}_k$ is the local Earth magnetic field vector, $\vec{b}_m$ is the hard iron bias vector (e.g., due to a constant magnetic field in the local magnetometer operating area), $\vec{n}_m$ is the measurement noise vector, $A_{mc}$ is a 3×3 matrix consisting of soft iron bias (the effect of ferromagnetic material in the local magnetometer operating area), misalignment of the magnetometer measurement axes, and scale factor errors of the sensed magnetometer measurements, and $C_{bm}$ is the direction cosine matrix from the magnetometer measurement frame to the body frame.

It should be noted that the magnetometer calibration algorithm is based on certain assumptions. These assumptions include that the crane jib orientation is unknown and is slewed in a circular motion, and that the local Earth magnetic field vector at the tower crane location is fixed and unknown. It is further assumed that the following errors affect the magnetometer measurements: hard iron errors, soft iron errors, misalignment errors, and scale factor errors. Moreover, the local magnetic operating environment can be modeled as a two-dimensional ellipse because the crane jib is restricted to circular motion and the crane jib roll and pitch angles are relatively small, so that the magnetometer measurements can be calibrated without leveling the magnetometers.

With the above background in mind, the magnetometer calibration algorithm (510) fits an ellipse to the magnetometer measurements, and then computes parameters that transform the ellipse to a canonical circle. The general equation for a two-dimensional ellipse is:

$$Am_{mx}^2 + Bm_{mx}m_{my} + Cm_{my}^2 + Dm_{mx} + Em_{my} + F = 0,$$

where A, B, C, D, E, and F are unknown, constant scalar parameters, $m_{mx}$ are magnetometer measurements in the x-axis, and $m_{my}$ are magnetometer measurements in the y-axis. As noted above, the crane jib roll and pitch angles are relatively small, thus the magnetometer measurements in the z-axis are not needed. Using standard techniques, the following least squares formulation at time $t_k$, may be used to solve for A, B, C, D, E, and F:

$$[m_{mx,k}^2 \quad m_{mx,k}m_{my,k} \quad m_{my,k}^2 \quad m_{mx,k} \quad m_{my,k} \quad 1]\begin{bmatrix}A\\B\\C\\D\\E\\F\end{bmatrix} = 0$$

$$A_k X = 0,$$

where X is a matrix of the unknown constant parameters (A, B, C, D, E, and F), and $A_k$ are magnetometer measurements at time $t_k$.

The algorithm used to transform an ellipse to a canonical circle includes determining the orientation of the major and minor axes of the ellipse, determining the semi-major and semi-minor axes of the ellipse, and determine the bias of the ellipse from the center of the canonical circle. The parameters of the ellipse are the magnetometer measurement errors that were identified above. The general equation that is used is:

$$\left[\frac{y_1 + \frac{D}{2\lambda_1}}{\sqrt{\frac{\alpha}{\lambda_1}}}\right]^2 + \left[\frac{y_2 + \frac{E}{2\lambda_2}}{\sqrt{\frac{\alpha}{\lambda_2}}}\right]^2 = 1,$$

where $$\frac{D}{2\lambda_1}$$

and $$\frac{E}{2\lambda_2}$$

are the bias of the center of the ellipse from the center of a canonical circle, and $$\sqrt{\frac{\alpha}{\lambda_1}}$$

and $$\sqrt{\frac{\alpha}{\lambda_2}}$$

are the semi-major and semi-minor axes, respectively. Moreover:

$$P = \begin{bmatrix} A & \frac{B}{2} \\ \frac{B}{2} & C \end{bmatrix} = Q\hat{P}Q^T,$$

$$\hat{P} = \begin{bmatrix} \lambda_1 & 0 \\ 0 & \lambda_2 \end{bmatrix},$$

$$\begin{bmatrix} y_1 \\ y_2 \end{bmatrix} = Q^T \begin{bmatrix} m_{mx} \\ m_{my} \end{bmatrix},$$

$$[\overline{D} \ \overline{E}] = [D \ E]Q, \text{ and}$$

$$\alpha = -F + \lambda_1\left(\frac{\overline{D}}{2\lambda_1}\right)^2 + \lambda_2\left(\frac{\overline{E}}{2\lambda_2}\right)^2,$$

where $\lambda_1, \lambda_2$ are the eigenvalues of the P matrix, and Q contains the eigenvectors of the P matrix corresponding to the eigenvalues $\lambda_1, \lambda_2$.

After the magnetometer calibration algorithm (510) is complete, the AHRS filters 214, 216 are initialized (512). For this portion of the process 500, an initial state vector is provided and is defined as: (1) an initial velocity of 0.0 m/s; (2) no tower crane maneuvers are conducted, which means that at least the operator is not slewing the crane jib, moving the cable trolley, or moving the cable hook block; (3) the initial accelerometer biases are 0 m/s$^2$; (4) the initial roll and pitch angles are supplied from the inclinometer 208; (5) the initial heading angle, based on the calibrated magnetometer measurements, is adjusted to 0° (note that all magnetometer measurements will be adjusted using the initial heading angle computed from the calibrated magnetometer measurements); (6) the initial roll, pitch, and heading angles are converted to quaternions; and (7) the initial angular rate sensor biases are set to 0.0 rad/s.

The exit conditions (514) are met when: the absolute value of the estimated (mean) roll angle error (filter-based roll angle—inclinometer roll angle)<0.1°, the roll angle (1–σ) estimation error has converged, the absolute value of the estimated (mean) pitch angle error (filter-based pitch angle—inclinometer pitch angle)<0.1°, the pitch angle (1–σ) estimation error has converged, the absolute value of the estimated (mean) heading angle error (filter-based heading angle—magnetometer based heading angle)<0.1°, the heading angle (1–σ) estimation error has converged, and the elapsed filter operational time is about 1 minute. When these exit conditions are met, the initialization/alignment mode is exited (516), and normal tower crane operation and AHRS filter operation may occur.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. The word "exemplary" is used exclusively herein to mean "serving as an example, instance, or illustration." Any embodiment described herein as "exemplary" is not necessarily to be construed as preferred or advantageous over other embodiments.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of calibrating an attitude and heading reference system of a crane jib, comprising the steps of:
   while one or more crane jib maneuvers are performed, collecting magnetometer measurements using a magnetometer that is attached to the crane jib;
   supplying the magnetometer measurements to a processor; and
   in the processor, generating magnetometer calibration parameters using the magnetometer measurements,
   wherein the magnetometer calibration parameters are generated using an algorithm that fits an ellipse to the magnetometer measurements and computes parameters that transform the ellipse to a canonical circle.

2. The method of claim 1, wherein:
   the attitude and heading reference system includes a plurality of filters; and
   the method further comprises initializing and aligning each of the filters.

3. The method of claim 1, wherein the one or more crane jib maneuvers include one or more of slewing the crane jib, moving a cable trolley mounted on the crane jib, and moving a cable hook block mounted on the crane jib.

4. The method of claim 3, wherein the one or more crane jib maneuvers includes slewing the crane jib at least one complete rotation through the available range of motion.

5. The method of claim 1, wherein the magnetometer calibration parameters are generated using a magnetometer measurement model.

6. The method of claim 5, wherein the magnetometer measurement model is defined as:

$$C_{bm} \vec{m}_m(t_k) = A_{mc}(t_k) \vec{m}_k(t_k) + C_{bm} \vec{b}_m(t_k) + C_{bm} \vec{n}_m(t_k),$$

where $\vec{m}_m$ is a magnetometer measurement vector, $\vec{m}_k$ is the local Earth magnetic field vector, $\vec{b}_m$ is a hard iron bias vector, $\vec{n}_m$ is a measurement noise vector, $A_{mc}$ is a 3×3 matrix consisting of soft iron bias, misalignment of magnetometer measurement axes, and scale factor errors of sensed magnetometer measurements, and $C_{bm}$ is a direction cosine matrix from a magnetometer measurement frame to a body frame.

7. A method of calibrating an attitude and heading reference system of a crane jib, comprising the steps of:
   rendering commands on a display device that inform an operator to implement one or more crane jib maneuvers;
   generating magnetometer measurements, using a magnetometer that is attached to the crane jib, while the one or more crane jib maneuvers are being implemented;
   supplying the magnetometer measurements to a processor; and
   in the processor, generating magnetometer calibration parameters using the magnetometer measurements,
   wherein the magnetometer calibration parameters are generated using an algorithm that fits an ellipse to the magnetometer measurements and computes parameters that transform the ellipse to a canonical circle.

8. The method of claim 7, wherein:
   the attitude and heading reference system includes a plurality of filters; and
   the method further comprises initializing and aligning the plurality of filters using the magnetometer calibration parameters.

9. The method of claim 7, wherein the step of initializing and aligning the plurality of filters comprises:
   supplying initial state vector statistics to each of the filters, the initial state vector statistics including initial state vectors that are based in part on the magnetometer calibration parameters; and
   in the processor, determining at least when filter-based measurements converge to within predetermined values of sensor measurements.

10. The method of claim 7, wherein the magnetometer calibration parameters are generated using a magnetometer measurement model.

11. The method of claim 10, wherein the magnetometer measurement model is defined as:

$$C_{bm}\vec{m}_m(t_k) = A_{mc}(t_k)\vec{m}_k(t_k) + C_{bm}\vec{b}_m(t_k) + C_{bm}\vec{n}_m(t_k),$$

where $\vec{m}_m$ is a magnetometer measurement vector, $\vec{m}_k$ is the local Earth magnetic field vector, $\vec{b}_m$ is a hard iron bias vector, $\vec{n}_m$ is a measurement noise vector, $A_{mc}$ is a 3×3 matrix consisting of soft iron bias, misalignment of magnetometer measurement axes, and scale factor errors of sensed magnetometer measurements, and $C_{bm}$ is a direction cosine matrix from a magnetometer measurement frame to a body frame.

12. A crane jib attitude and heading reference system, comprising:
 a plurality of magnetometers, each magnetometer configured to sense local magnetic field at least proximate the crane jib and supply magnetometer signals representative thereof; and
 a processor coupled to receive the magnetometer signals and configured, upon receipt thereof, to generate magnetometer calibration parameters,
 wherein the magnetometer calibration parameters are generated using an algorithm that fits an ellipse to the magnetometer measurements and computes parameters that transform the ellipse to a canonical circle.

13. The crane jib attitude and heading reference system of claim 12, wherein the processor implements a plurality of filters and is further configured to supply initial state vector statistics to each of the filters.

14. The crane jib attitude and heading reference system of claim 12, wherein the processor generates the magnetometer calibration parameters using a magnetometer measurement model.

15. The crane jib attitude and heading reference system of claim 14, wherein the magnetometer measurement model is defined as:

$$C_{bm}\vec{m}_m(t_k) = A_{mc}(t_k)\vec{m}_k(t_k) + C_{bm}\vec{b}_m(t_k) + C_{bm}\vec{n}_m(t_k),$$

where $\vec{m}_m$ is a magnetometer measurement vector, $\vec{m}_k$ is the local Earth magnetic field vector, $\vec{b}_m$ is a hard iron bias vector, $\vec{n}_m$ is a measurement noise vector, $A_{mc}$ is a 3×3 matrix consisting of soft iron bias, misalignment of magnetometer measurement axes, and scale factor errors of sensed magnetometer measurements, and $C_{bm}$ is a direction cosine matrix from a magnetometer measurement frame to a body frame.

16. The crane jib attitude and heading reference system of claim 12, wherein:
 the processor implements a plurality of filters; and
 the processor is further configured to initialize and align the plurality of filters using at least the magnetometer calibration parameters.

17. The crane jib attitude and heading reference system of claim 16, wherein the processor is configured to:
 supply initial state vector statistics to each of the filters, the initial state vector statistics including initial state vectors that are based in part on the magnetometer calibration parameters; and
determine at least when filter-based measurements converge to within predetermined values of sensor measurements.

* * * * *